(12) United States Patent
Payne et al.

(10) Patent No.: US 6,347,395 B1
(45) Date of Patent: Feb. 12, 2002

(54) METHOD AND ARRANGEMENT FOR RAPID SILICON PROTOTYPING

(75) Inventors: Robert Payne, San Jose, CA (US); Mark Bapst, South Barrington; Timothy Pontius, Lake in the Woods, both of IL (US)

(73) Assignee: Koninklijke Philips Electronics N.V. (KPENV), Einhoven (NL)

( * ) Notice: Subject to any disclaimer, the term of this patent is extended or adjusted under 35 U.S.C. 154(b) by 0 days.

(21) Appl. No.: 09/215,942

(22) Filed: Dec. 18, 1998

(51) Int. Cl.$^7$ .............................................. G06F 17/50
(52) U.S. Cl. ................................. 716/18; 716/1; 716/4
(58) Field of Search ............................. 716/18, 1, 3, 4; 710/100, 56, 128, 62, 129

(56) References Cited

U.S. PATENT DOCUMENTS

| | | | |
|---|---|---|---|
| 5,577,213 A | * 11/1996 | Avery et al. | 710/100 |
| 5,581,669 A | * 12/1996 | Voth | 358/1.14 |
| 5,612,891 A | 3/1997 | Butts et al. | 716/16 |
| 5,661,662 A | 8/1997 | Butts et al. | 716/16 |
| 5,678,037 A | 10/1997 | Osugi et al. | 345/525 |
| 5,872,998 A | * 2/1999 | Chee | 710/56 |
| 6,006,022 A | * 12/1999 | Rhim et al. | 703/25 |
| 6,058,263 A | * 5/2000 | Voth | 703/25 |
| 6,154,803 A | * 11/2000 | Pontius et al. | 710/128 |

OTHER PUBLICATIONS

Gibson et al, "Practical Concurrent ASIC and System Design and Verification," IEEE, Mar. 1997, pp. 532–536.*

Rosa Weber, "a Integrated Hardware and Software Reuse Evironment for System Development," IEEE, May 1991, pp. 990–996.*

Vu Tran, "Component–Based Integrated System Development: a Model for the Emerging Procurement–Centric Approach to Software Development," IEEE, Aug. 1998, pp. 128–135.*

Lassing et al, "a View on Components," IEEE, Aug. 1998, pp. 768–777.*

ARM7TDMI Data Sheet, Advanced RISC Machines Ltd., Chapters 1 through 12 (Issued Aug. 1995).

AMBA Advanced Microcontroller Bus Architecture Specification, Advanced RISC Machines Ltd. (Issued Apr. 1997).

* cited by examiner

Primary Examiner—Matthew Smith
Assistant Examiner—Vuthe Siek
(74) Attorney, Agent, or Firm—Crawford PLLC

(57) ABSTRACT

A rapid silicon processing arrangement significantly decreases the time from initial design to market introduction. Consistent with one embodiment of the present invention, rapid silicon processing arrangement uses a deconfigurable and extendible reference-chip development platform that includes a programmable device such as an electronically reconfigurable gate array and an off-platform bus for communicating with external devices. The reference-chip development platform can be deconfigured by deselecting communicative activity by one or more of functional block macros. The external devices can be used with the reference-chip development platform to test a hardware representation of the synthesized of the functional block macros in the programmable device within the reference-chip development platform as extended by the off-platform bus. The approach significantly decreases the development time, from initial design to market introduction.

30 Claims, 10 Drawing Sheets

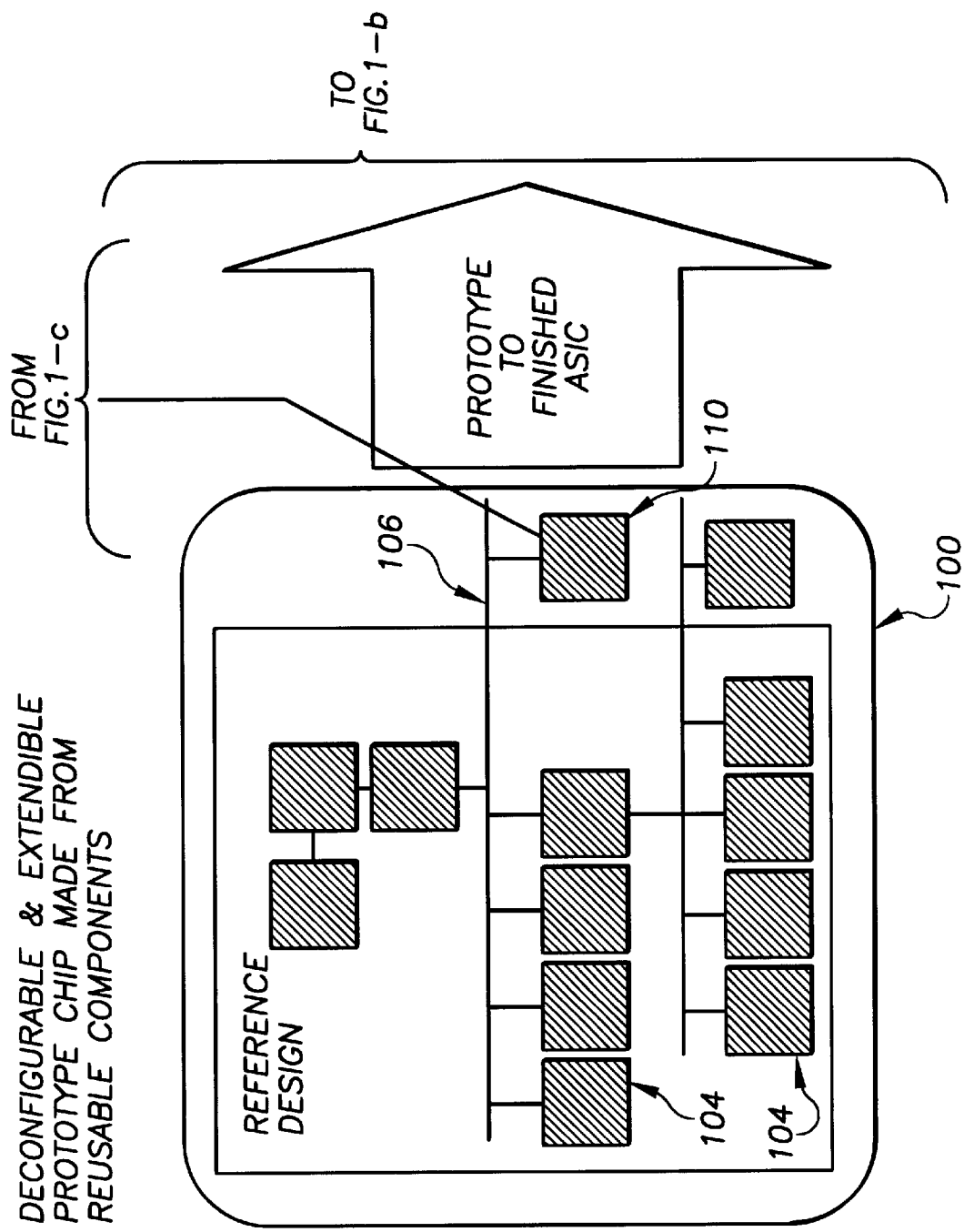
FIG.1-a

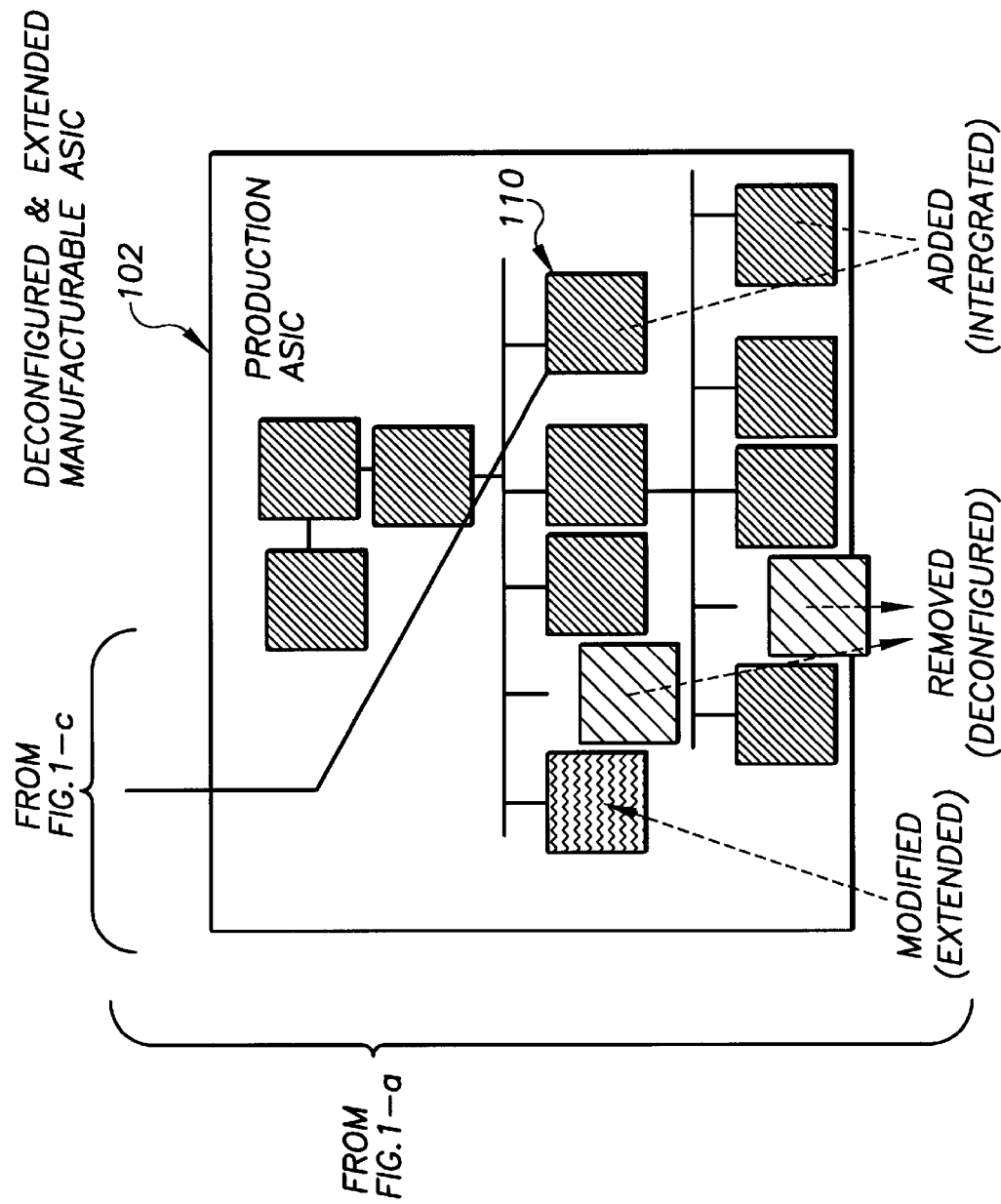

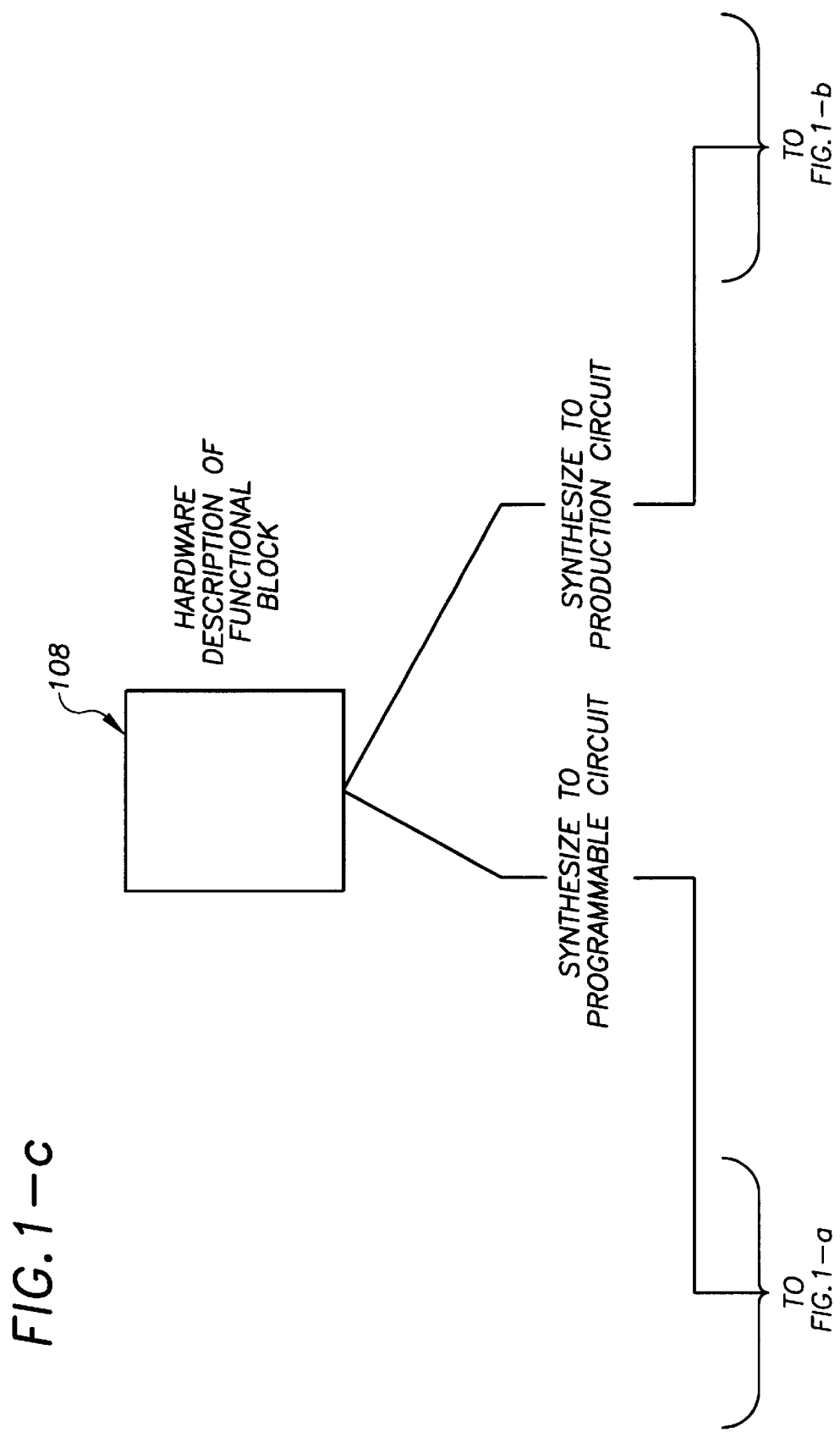

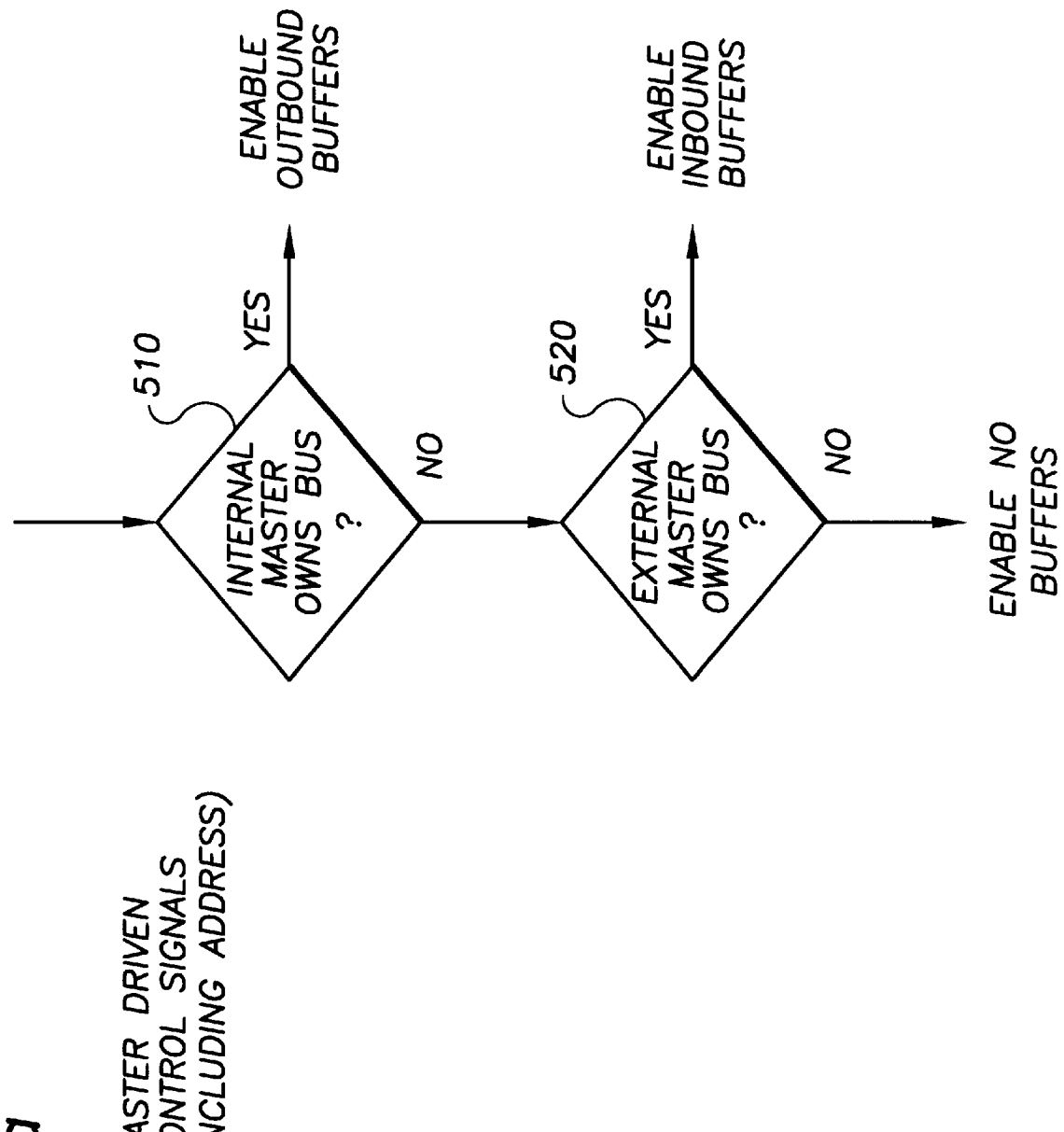

METHOD AND ARRANGEMENT FOR RAPID SILICON PROTOTYPING

FIELD OF THE INVENTION

The present invention is directed generally to semiconductors and their design and development involving hardware simulation (or emulation). More particularly, the invention relates to hardware emulation methods and arrangements involving reconfigurable and reusable circuits in an IC reference platform for expediting the design time of customized chips.

BACKGROUND OF THE INVENTION

The electronics industry continues to strive for high-powered, high-functioning circuits. Significant achievements in this regard have been realized through the fabrication of very large-scale integration of circuits on small areas of silicon wafer. Integrated circuits of this type are developed through a series of steps carried out in a particular order. The main objective in designing such devices is to obtain a device that conforms to geographical features of a particular design for the device. To obtain this objective, steps in the designing process are closely controlled to insure that rigid requirements are realized.

Semiconductor devices are used in large numbers to construct most modern electronic devices. In order to increase the capability of such electronic devices, it is necessary to integrate even larger numbers of such devices into a single silicon wafer. As the semiconductor devices are scaled down (i.e., made smaller) to form a larger number of devices on a given surface area, the structure of the devices and the fabrication techniques used to make such devices have become more refined. This increased ability to refine such semiconductor devices has lead to an ever-increasing proliferation of customized chips, and with each chip serving a unique function and application. This, in turn, has lead to various techniques to design and successfully test chips efficiently and inexpensively.

For many chip designs, customized chips are made by describing their functionality using a hardware-description language (HDL), such as Verilog or VHDL. The hardware description is often written to characterize the design in terms of a set of functional macros. The design is computer simulated to ensure that the custom design criteria are satisfied. For highly-complex custom chip designs, the above process can be burdensome and costly. The highly integrated structure of such chips leads to unexpected problems, such as signal timing, noise-coupling and signal-level issues. Consequently, such complex custom chip designs involve extensive validation. This validation is generally performed at different stages using a Verilog or VHDL simulator. Once validated at this level, the Verilog or VHDL HDL code is synthesized, for example, using "Synopsys," to a netlist that is supplied to an ASIC (Application Specific Integrated Circuit) foundry for prototype fabrication. The ASIC prototype is then tested in silicon. Even after such validation with the Verilog or VHDL simulator, unexpected problems are typical. Overcoming these problems involves more iterations of the above process, with testing and validation at both the simulation and prototype stages. Such repetition significantly increases the design time and cost to such a degree that this practice is often intolerable in today's time-sensitive market.

Accordingly, there is a need for a way to develop customized chips that overcomes the above-mentioned deficiencies. The present invention addresses this need, and other needs, by way of a rapid silicon prototyping (RSP) process and arrangement in which a typical development period (from initial design to new product) can be reduced by more than fifty percent.

SUMMARY OF THE INVENTION

The present invention relates to a semiconductor device designed using a rapid silicon process and/or processing arrangement. According to the present invention, the design effort of such devices is significantly benefited in connection with the design validation phase of the overall device implementation.

According to one embodiment, a rapid silicon process and processing arrangement involves the design of a high-complexity custom chip using design re-use, and on-chip bus architectures in a way that improves the ability of designers to create advanced custom integrated circuits (ICs) faster and with higher probabilities of success.

Consistent with one embodiment, the present invention is directed to a method for designing a semiconductor circuit arrangement, including its validation. The method comprises: providing a deconfigurable and extendible reference-chip development platform that is programmable, and that includes a programmable circuit and a plurality of functional block macros; using a collection of functional block macros at least one of which is obtained from the deconfigurable and extendible reference-chip development platform; extending the deconfigurable and extendible reference-chip development platform, including communicatively coupling at least one external device with the reference-chip development platform, and thereby providing an extended reference-chip development platform that enables co-development and co-validation of hardware and software; synthesizing a subset of the collection of functional block macros to the programmable circuit; and validating a hardware representation of the synthesized subset of functional block macros in the programmable circuit within the extended reference-chip development platform.

Consistent with another embodiment, the present invention is directed to a rapid silicon process involving the validation of a FPGA and its implementation to a finished ASIC. This method embodiment of the present invention comprises the above-characterized method and in addition using at least one of the functional block macros in the subset from a functional block macro obtained from the deconfigurable and extendible reference-chip development platform and reusing this same functional block macro(s) in the subset by retargeting to an ASIC that is developed from the hardware representation.

According to another embodiment, the present invention is directed to a system for designing a semiconductor circuit arrangement. The system comprises: a deconfigurable and extendible reference-chip development platform that is programmable, and includes a hardware reconfigurable circuit and a plurality of functional block macros; a collection of functional block macros at least one of which is obtained from the deconfigurable and extendible reference-chip development platform; an interface circuit configured and arranged to extend the deconfigurable and extendible reference-chip development platform, including a two-way buffer arrangement and logic circuitry adapted to communicatively couple a plurality of external devices with the reference-chip development platform, and thereby provide an extended reference-chip development platform that enables co-development and co-validation of hardware and software; a synthesizer adapted to cause the subset of the collection of functional block macros to be represented as a configuration of the hardware reconfigurable circuit; and wherein the extended reference-chip development platform is adapted to validate the configuration in the hardware reconfigurable circuit within the extended reference-chip development platform.

Another aspect of the present invention is directed to a system for designing a semiconductor circuit arrangement. The system comprises: a deconfigurable and extendible reference-chip development platform that is programmable, and includes a programmable circuit and a plurality of functional block macros; a collection of functional block macros at least one of which is obtained from the deconfigurable and extendible reference-chip development platform; an interface circuit configured and arranged to extend the deconfigurable and extendible reference-chip development platform, including a bus and logic circuitry adapted to communicatively couple at least one external device with the reference-chip development platform, and thereby provide an extended reference-chip development platform that enables co-development and co-validation of hardware and software; a synthesizer adapted to cause the subset of the collection of functional block macros to be represented as a configuration of the programmable circuit; and wherein the extended reference-chip development platform is adapted to validate the configuration in the programmable circuit within the extended reference-chip development platform.

Other aspects of the present invention are directed and related to apparatuses and methods of design validation, each using one or more of the above rapid silicon process features.

The above summary of the present invention is not intended to describe each illustrated embodiment or every implementation of the present invention. The figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 1a, 1b and 1c illustrate how a chip development reference design (FIG. 1a) can be used to validate a functional macro described in HDL (FIG. 1c) and later re-targeted to a manufactured ASIC (FIG. 1b), in accordance with a rapid silicon prototyping embodiment that is consistent with the present invention;

FIGS. 5a, 5b and 5c illustrate an example embodiment of a process for interfacing data using the interface arrangement of FIG. 4, according to the present invention.

Figure 2:
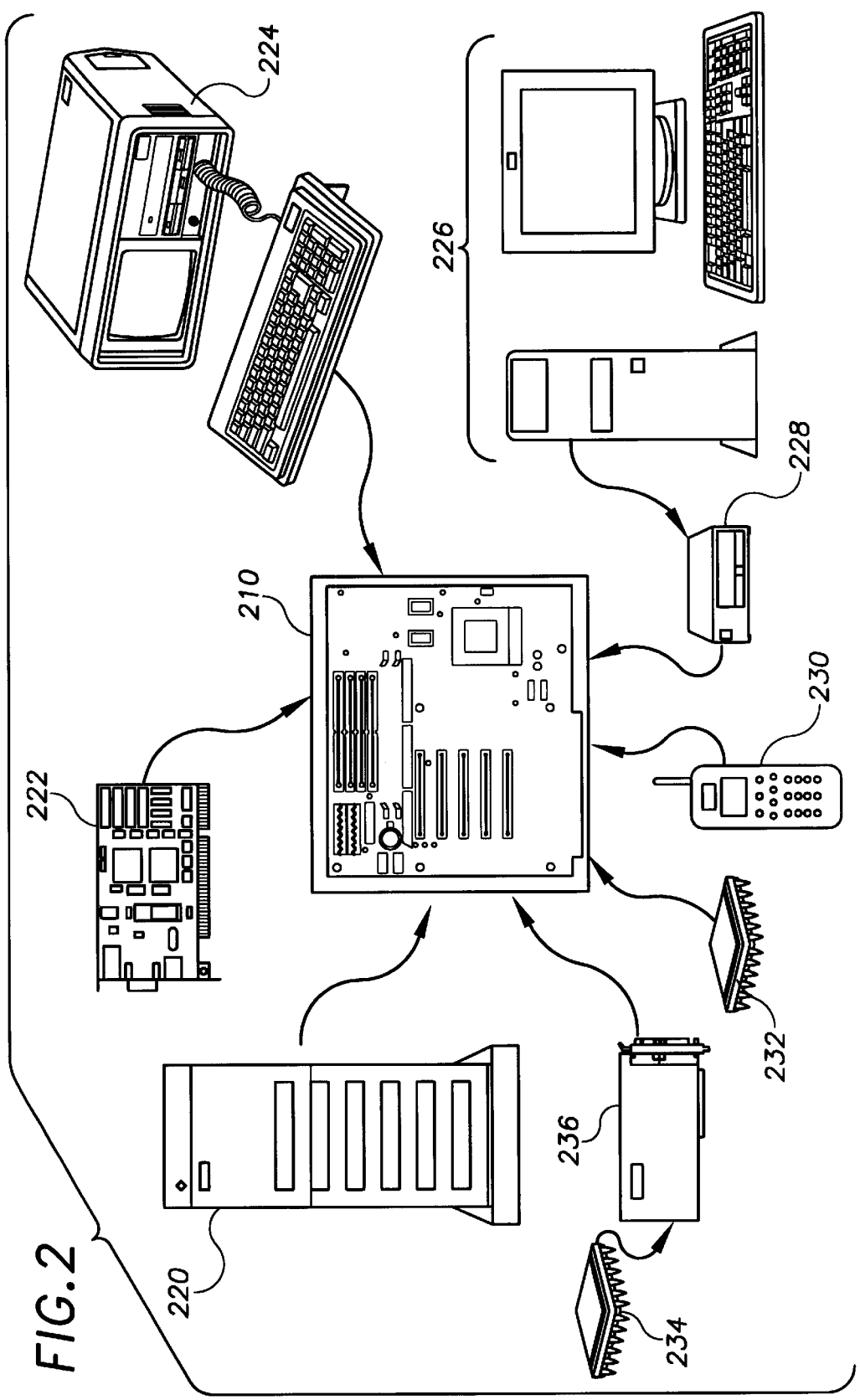
FIG. 2 illustrates a rapid silicon prototyping arrangement, according to one aspect of the present invention.

While the invention is amenable to various modifications and alternative forms, specifics thereof have been shown by way of examples in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be generally applicable to the design of custom semiconductor chip devices. The invention has been found to be particularly advantageous for validation applications involving the development of highly-complex custom semiconductor chips where efficiency in terms of cost and turn-around time are considered to be important. While the present invention is not so limited, an appreciation of various aspects of the invention is best gained through a discussion of examples in such an environment where a functional block is defined in a hardware description language and then synthesized into a programmable circuit.

Turning now to the drawings, FIGS. 1a and 1b illustrate a rapid silicon prototyping implementation, according to the present invention, at two different stages of development. FIG. 1a includes a reference-chip development platform 100 that employs a collection of functional block macros 104 to design a custom silicon chip. The reference-chip development platform 100 is used in connection with a method involving a number of steps, including the integration of selected ones of the functional block macros 104, the deselection or deconfiguration of other ones of the functional block macros 104, and the synthesis of HDL source code into a hardware (re-) configurable circuit 110.

FIG. 1b depicts a derivative of the reference-chip development platform 100 in the form of a validated custom integrated circuit 102. A functional prototype of the custom integrated circuit 102 is validated on the reference-chip development platform 100 before manufacturing device 102, using various tools that can validate for, and/or be integrated with, the specified design criteria, such as a customer's requirements for a specific application, as characterized by the selected and deselected functional block macros 104.

FIG. 1c depicts a functional macro 110 described in HDL code 108 that is targeted to the reference-chip development platform 100 by synthesizing it. Subsequently, the same HDL code 108 is synthesized for the final ASIC 102 without requiring modification. The functional macro 110 that is integrated into the final ASIC 102 has already been validated in the reference-chip development platform 100.

A software program is developed to exercise the hardware in the reference-chip development platform 100. This same program can be reused to exercise the custom integrated circuit 102.

Consistent with these above-discussed features, the deconfigurability and extendibility aspects permit both for reduction of potential (but unneeded) functionality and for use of external devices in connection with the reference-chip development platform 100. These aspects of the present invention offer significant advantages in connection with the emulation and debugging of the custom integrated circuits, such as the integrated circuit 102 shown in FIG. 1b.

In this context, deconfigurability refers to the deselection of communicative activity by one or more programmable components, depicted as blocks 104 in FIG. 1a. For example, the components 104 can be deselected by programming the reference-chip development platform 100 such that the blocks 104 are not addressed, thereby disabling communication by ignoring the blocks 104. The components 104 can also be removed without impacting the programmed reference-chip development platform 100. In alternative embodiments, the components 104 are deselected, respectively, by physically disabling communication to components 104. Example methods of physically disabling communication include programming configuration registers, reassigning memory maps, or de-asserting external enable signals. In each of these alternative embodiments, the reference-chip development platform 100 can be programmed such that they attempt to address and communicate with the blocks 104 or programmed such that they do not attempt to address and communicate with the blocks 104.

Extendibility is provided by the reference-chip development platform 100 permitting external devices to be coupled to the reference-chip development platform by way of an off-platform bus 106 that does not require use of a bus bridge and its associated clocking protocol. Thus, this extendibility permits for virtual transparency insofar as the external devices are able to communicate with the reference-chip development platform via the bus 106, as though the external devices were physically on the integrated circuit (IC) and part of the reference-chip development platform. As further discussed below, this virtual transparency is implemented using a master/slave communication relationship involving a two-way signal buffer as an interface between the reference-chip development platform and the external devices.

According to one specific implementation, each or selected ones of the components 104 are repeatedly used for a multitude of chip design applications.

FIG. 2 illustrates other examples of how the deconfigurability and extendibility can be used, according to the present invention, to develop a custom IC, such as the IC 102 of FIG. 1b. More specifically, FIG. 2 illustrates an example system including a reference-chip development platform 210, constructed and arranged with the above-discussed features.

Further, FIG. 2 illustrates a hardware accelerator 220, a standard plug-in board 222, a logic analyzer 224, a microprocessor-based host compiler and debugger 226 coupled to the reference-chip development platform 210 using a JTAG control module 228, and a user interface 230. In one example implementation, the hardware accelerator 220 is implemented using equipment commercially available from IKOS Systems, Inc. The microprocessor-based host compiler and debugger 226 is implemented, in various embodiments, using one of several different types of programmable processors, including but not limited to an ARM or a DSP (such as VLSI Technology's OAK or Palm type processors).

The standard plug-in board 222 is used to extend the system beyond the FPGA capability and to provide connectivity with the off-chip bus (e.g., bus 106 of FIG. 1a). Example types of plug-in boards that may be used in this regard include those available from VLSI Technology Inc.; user's.f the reference-chip development platform 210, however, can implement any custom or conventional plug-on logic for communication with the reference design busses.

The logic analyzer 224 is used to monitor the progress of the logic states of the functional block under evaluation. Compatible logic analyzers are available from Hewlett Packard, Inc. In one implementation, the logic analyzer 224 is programmed with HP Logic Analyzer Configuration Files, which are available from VLSI Technology, Inc. of San Jose, Calif.

The microprocessor-based host compiler and debugger 226 is conventional (e.g., a VLSI Technology Jumpstart Tool) and is used to compile and debug software source code. The JTAG control module 228 can be implemented using any JTAG control device such as the Jeeni box available from VLSI Technology, Inc.

The user interface 230 is exemplified in FIG. 2 as a conventional cellular telephone, but can be any "box" (or product) that would be implemented by the result of the development/validation effort via the reference-chip development platform 210. In a typical application, user interface 230 includes an output (such as an electronic display or scribed output) and an input (such as a keypad or switches) for inputting data to the reference-chip development platform 210. In this manner, the reference-chip development platform 210 is used to test and validate the functionality of the design of the subject FPGA(s) while using actual input and generating actual output data representative of the system being implemented.

An on-board FPGA (field programmable gate array) 232 is used to integrate application and/or customer specific functional blocks onto the busses (106 of FIG. 1a). In connection with integrating such functional blocks onto the busses to implement a functional block macro, the FPGA 232 can be used, other devices such as the hardware accelerator 220 and the FPGA prototype arrangement 234/236 can be used, or two or more of these input configuration sources can be in combination. It will also be appreciated that the ASIC is merely one type of programmable circuit into which such functional block macros are synthesized. Other types of programmable circuits of the hardware-configurable types include, but are not limited to, programmable logic devices (PLDs) including PALs and PLAs, complex PLDs, FPGAs and microcontrollers.

Figures 1, 3:
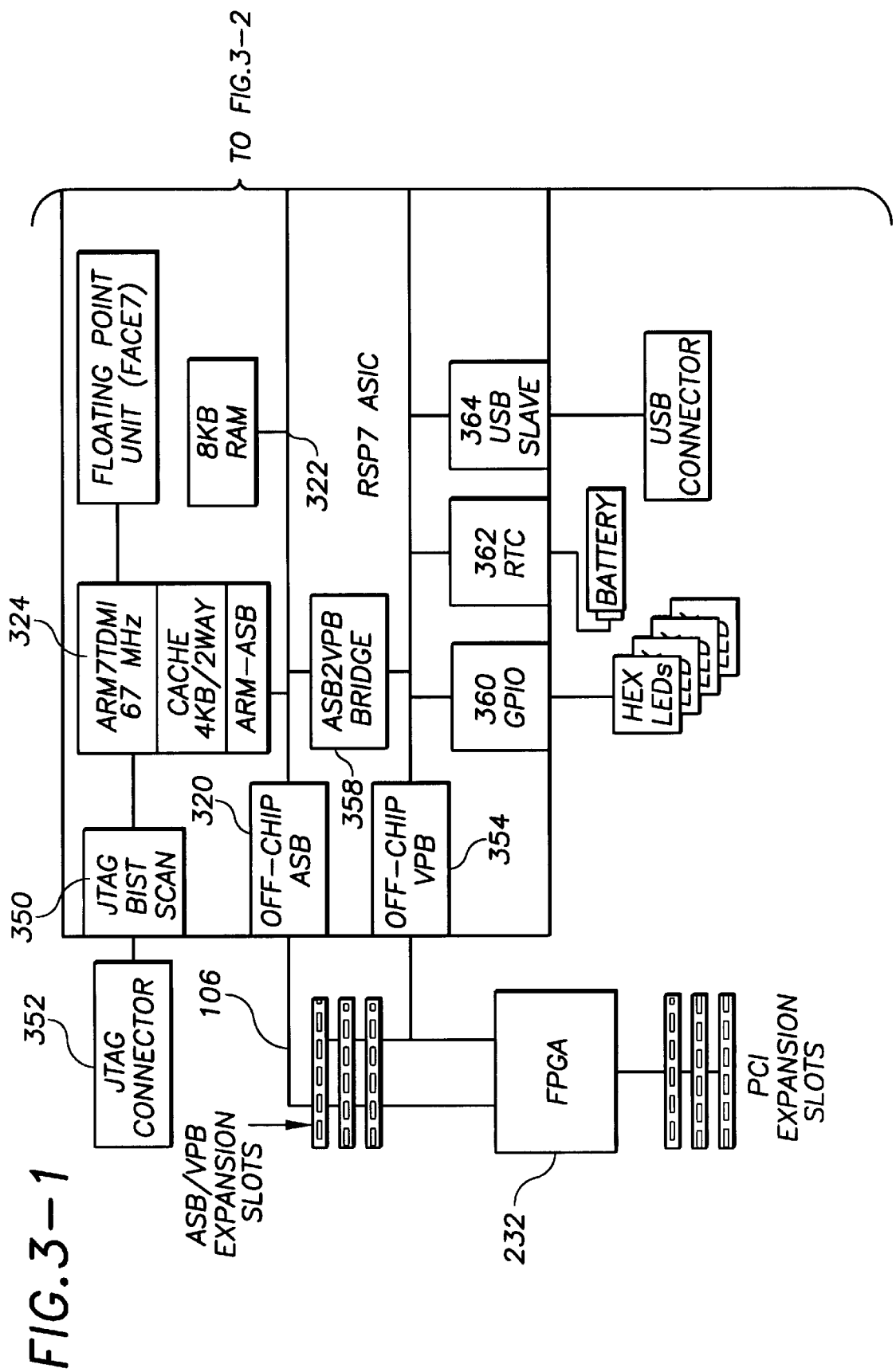
FIG. 3 illustrates an example embodiment of an emulation board, according to another aspect of the present invention.
Figures 2, 3:
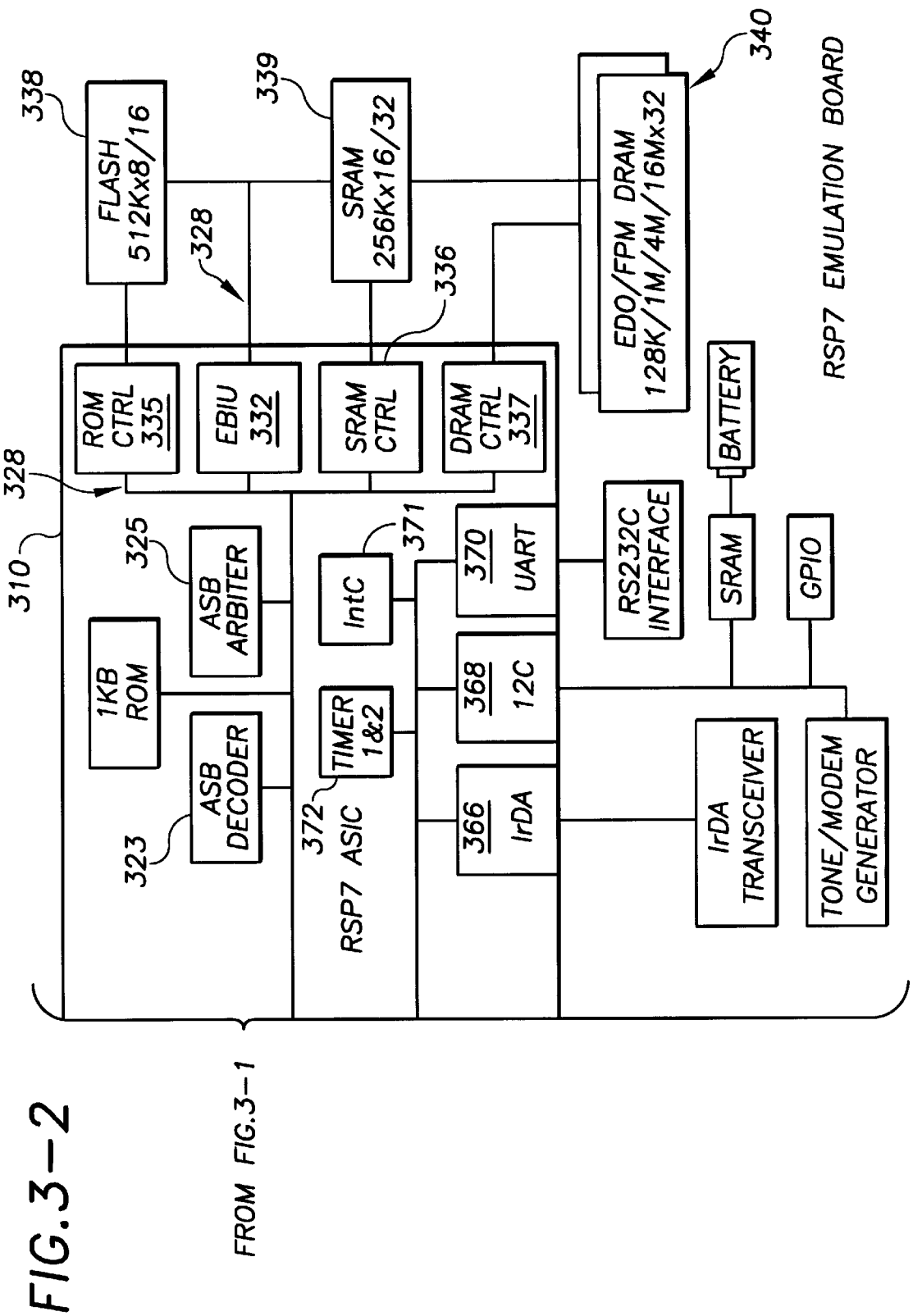

FIG. 3 illustrates an example embodiment of how the FPGA 232 functionality is validated using the emulation board. Once the application or customer specific functional blocks are integrated onto the busses, functional blocks inside the FPGA 232 are accessible within the RSP IC 310 just as if these functional blocks were inside the RSP IC 310. The on-chip and off-chip logic, relative to the RSP IC 310, can then be operated as one cohesive system and hardware and software co-validation can commence.

The logic for integrating is downloaded into the FPGA 232 by first synthesizing a register-transfer-level (RTL) HDL description (for example, using Verilog or VHDL) 108 and then routing the resulting netlist into the FPGA 232. The developer then validates the function of that macro at or near real time speeds, usually by writing software to the target CPU (for example, the ARM CPU 324). Referring also to FIG. 2, logic analyzer(s) 224, oscilloscopes (not shown), software debuggers 226 and 228 and other tools such as USB Traffic Generators can be used to analyze various signals or model system interfaces. Internal signals on the block-under-test can easily be inspected by simply routing those signals to pins on the FPGA 232 and viewing them with the logic analyzer 224.

Once the system with the off-chip logic extensions is validated, the RSP IC 310 can be created. The same RTL description of the macro or macros, depicted as 108, that were put into the FPGA 232 can be synthesized at this stage using the same synthesis tools as before. No RTL modifications need to be made to the RTh HDL between the FPGA and ASIC versions. In this regard, the RSP acts as a "silicon simulator," permitting that which is validated in the RSP system to be built into the ASIC. The above-mentioned devices, that are external to the reference-chip development platform 210, are bus-coupled to the reference-chip development platform 210 for the purpose of synthesizing the functionally-defined block(s) and developing a customized FPGA prototype board 236, or on board FPGA 232, of FIG. 2.

Another important aspect of the present invention, and of the emulation board of FIG. 3, concerns the extendibility of the RSP IC 310 via the off-platform bus 106 (also in FIG. 1a) and an off-chip interface 320. The interface 320 uses a general bus 322, but can be implemented using any of a variety of interfaces, including but not limited to PCI (Peripheral Component Interconnect) and AMBA (Advanced Microcontroller Bus Architecture) ASB (Advanced System Bus) compliant interfaces. The example interface illustrated in FIG. 3 provides a two-way signaling interface between an ASB bus 322 and the off-platform bus 106. This two-way signaling interface is provided in connection with the microprocessor, in this illustrated example an ARM CPU, 324 coupled to the bus 322. The off-chip interface 320 is designed to provide virtual transparency between the external devices that are communicatively coupled via the off-platform bus 106 and the bus 322, with an important advantage being that no bus-bridge interface and/or its associated clocking protocols are needed to pass data therebetween. Accordingly, using the off-platform bus 106 and the off-chip interface 320, the RSP IC 310 forms part of an extended reference-chip development platform.

Where a typical bus interface would be a bus-bridge interface such as a PCI-bridge implementation, in accordance with the present invention, communication across the buffers in the off-chip interface 320 is implemented using a master/slave communication relationship. When any external device communicates using the bus 322, the off-chip interface 320 includes logic configured to determine whether the external device is the master or the slave. In this context, the master is the device initiating the communication, and the slave is the targeted respondent of the initiated communication. Once this master/slave determination is made, the logic controls the two-way buffers such that: for information written from the master to the slave, the control, address and data signals are copied from the master side of the off-chip interface 320 to the slave side of the off-chip interface 320; and for information read by the master from the slave, the control, address and data signals are copied from the slave side of the off-chip interface 320 to the master side of the off-chip interface 320.

A key advantage of this approach is that the programming for the CPU 324 does not depend on the location of the CPU, on-chip or off-chip, of functional macros resident on the busses. The logic in the interface 320 makes the communication virtually transparent. Consequently, with essentially only one CPU program to debug, the overall validation time is minimized.

The emulation board of FIG. 3 further includes a shared-address extension arrangement 328 that permits the CPU 324 to communicate with multiple units 335–340 via an external bus interface unit (EBIU) 332. In the example arrangement of FIG. 3, the multiple memory units include ROM, Flash, SRAM and DRAM types memory devices; others, however, may be used as well.

Other aspects of the emulation board are conventional and include interfaces well known to those skilled in the art. To name a few of those illustrated, the RSP IC 310 includes a conventional JTAG test port 350 for a JTAG test interface 352, an off-chip VLSI (Technology) Peripheral Bus (VPB) interface 354, and an on-chip ASB2VPB bridge interface 358. For further information concerning the interfaces 354 and 358 and VLSI Technology adaptations to the JTAG interface 350, reference may be made to commercially available VLSI Technology specifications characterizing these interfaces.

Communicating over the on-chip ASB2VPB bridge interface 358 are various conventional interfaces and devices. As shown in FIG. 3, these interfaces and devices include a general purpose input/output interface 360 for interfacing with a (dot-matrix or segment-type) display and an input device, a battery-powered real-time clock (RTC) unit 362, a universal serial bus (USB) interface 6 interface 366, an 12C interface 368, a UART device 370, an interrupt controller 371, and timers 372. The skilled artisan will appreciate that various implementations of this emulation board can include additional or fewer interfaces and devices. Including such interfaces and devices may depend upon factors including, among others, available silicon and congestion on one or more of the busses. Various commercially-available devices, such as the equipment addressed in the discussion above, can be used to enhance the flexibility of the design development and validation. For access to example equipment and software-related packages that may be useful in connection to various embodiments discussed above, reference may be made to the RSP7 User Guide, available from VLSI Technology, Inc., attached hereto as appendix.

Figure 4:
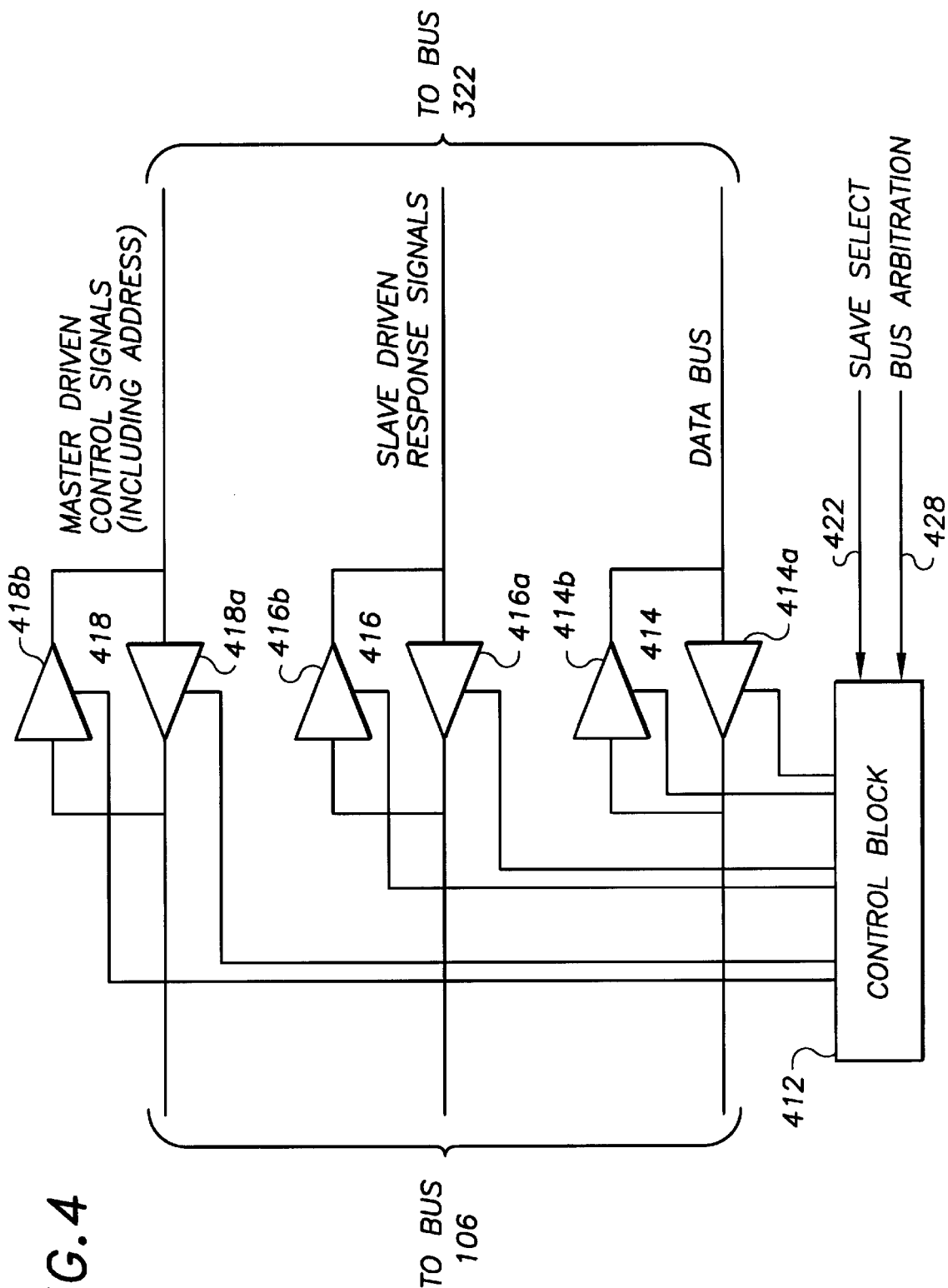
FIG. 4 illustrates an example embodiment of a two-way bus-buffer interface arrangement, according to another aspect of the present invention.

FIG. 4 illustrates a more particular example embodiment of a two-way interface arrangement 410, in accordance with the present invention, that can be used in connection with an implementation of the off-chip interface 320 of FIG. 3. The two-way interface arrangement 410 includes a logic (or control) circuit 412, and three sets of two-way buffers, a plurality of data bus buffers 414, a plurality of SD (slave-driven) buffers 416, and a plurality of MD (master-driven) buffers 418. One approach for implementing the off-chip interface 320 of FIG. 3 has the left side of the two-way interface arrangement 410 connecting to the off-platform bus 106 and the other side connecting to the bus 322. The logic (or control) circuit 412 responds to slave select status signals carried by lines 422 and to bus arbitration signals carried by lines 428. When the bus 322 is implemented using the illustrated AMBA ASB bus, the slave select status signals and the bus arbitration signals are as defined by the AMBA ASB bus/interface and respectively driven by a central bus decoder, depicted as 323 in FIG. 3, and a central bus arbiter, depicted as 325 in FIG. 3.

Consistent with the off-chip interface 320 of FIG. 3, the data bus buffer 414, the SD buffer 416 and the MD buffer 418 and the control block 412 are configured as described previously so as to provide a master/slave bus-copying communication relationship.

According to one specific embodiment, the two-way interface arrangement 410 has four noteworthy operations. First, using the bus arbitration signals, the control block 412 determines the location of the current master. For an AMBA ASB bus (e.g., bus 322 of FIG. 3), determining the location of the current master also requires that the control block 412 monitor the AMBA-ASB-defined AGNT and BWAIT signals. Second, the control block 412 determines the location of the current slave by monitoring the slave select status signals and, for an AMBA ASB bus, this determination requires monitoring the DSEL signals. Third, the control block 412 determines the direction in which data is to be transferred and, for an AMBA ASB bus, this determination requires monitoring the AMBA-ASB-defined BWRITE signal. A "read" entails a data transfer from slave to master, and a "write" entails a data transfer from master to slave. The fourth operation is the control block 412 enabling or disabling the three-state buffers between the two interfacing busses to effect proper bidirectional data movement.

Figure 5B:
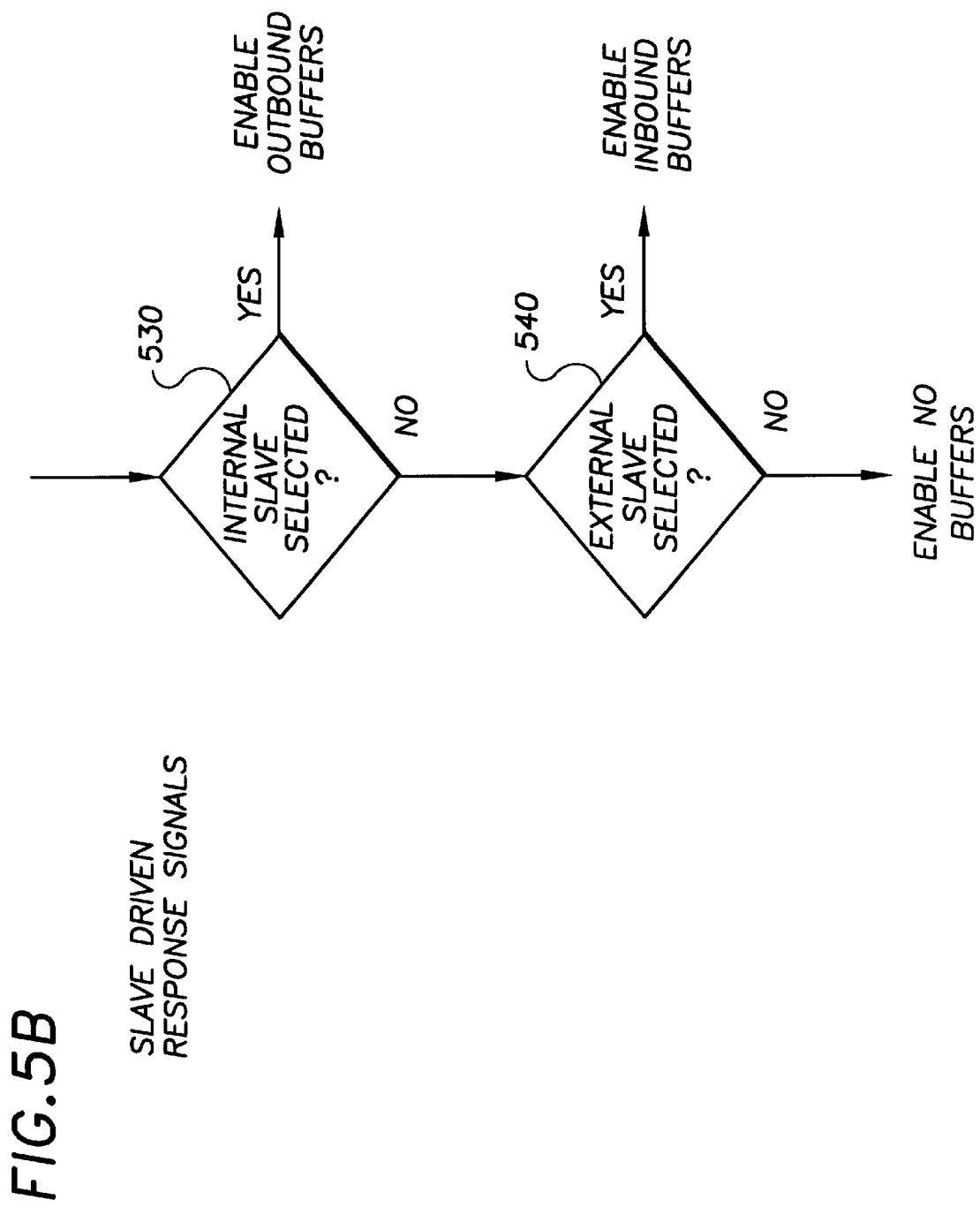
Figure 5C:
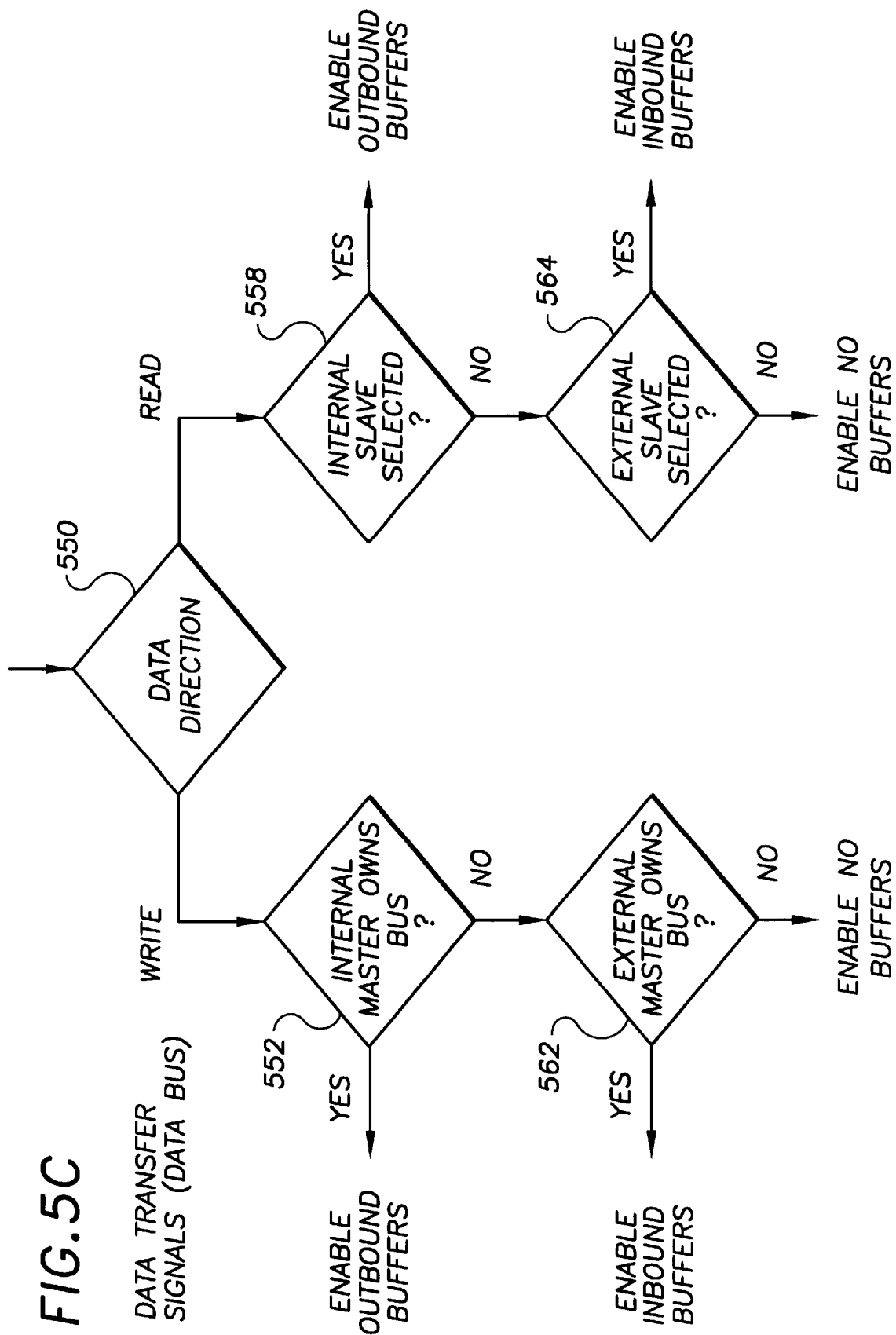

As shown in connection with FIGS. 5a, 5b and 5c, the three two-way buffers of FIG. 4 are enabled and disabled according to a set of general rules, an example of which follows.

FIG. 5a depicts an example set of rules for the MD buffer 418 for master-driven control (including address) signals. At block 510 of FIG. 5a, the control block 412 determines if an internal (relative to the IC) device currently has control over the bus, in which case the internal device is the master. The control block 412 responds to a determination that the internal device is the master by enabling the outbound buffers 418a of the MD buffer 418, and the control signals (including the address signals) are thereby copied from the internal side to the external side of the interface. If the control block 412 determines that an internal device currently does not have control over the bus, flow proceeds from decision block 510 to decision block 520 where the control block 412 determines if an external device is the master. If an external device is the master, the control block 412 responds by enabling the inbound buffers 418b of the MD buffer 418, and the control signals (including the address signals) are thereby copied from the external side to the internal side of the interface. If neither side has control over the bus, the control block 412 does not enable any of the buffers 418a, 418b.

FIG. 5b depicts an example set of rules for the SD buffer 416 for slave-driven response signals. At block 530 of FIG. 5b, the control block 412 determines if an internal (relative to the IC) device is currently selected as a slave. If so, the control block 412 responds by enabling the outbound buffers 416a of the SD buffer 416, and the response signals are thereby copied from the internal side to the external side of the interface. If the control block 412 determines that an internal device is not a slave, flow proceeds from decision block 530 to decision block 540 where the control block 412 determines if an external device is selected as a slave. If an external device is selected as a slave, the control block 412 responds by enabling the inbound buffers 416b of the MD buffer 416, and the response signals are thereby copied from the external side to the internal side of the interface. If neither side (internal or external) has a device selected as a slave, the control block 412 does not enable any of the buffers 416a, 416b.

FIG. 5c depicts an example set of rules for the data bus buffer 414 for data transfer signals. At block 550 of FIG. 5c, the control block 412 determines if data is being or read. If data is being written, the control block 412 proceeds to block 552 where it determines if an internal device is the master and, if so, the control block 412 enables the outbound buffers 414a of the data bus buffer 414. If data is being read, the control block 412 proceeds from block 550 to block 558 where it determines if an internal device is selected as a slave and, if so, the control block 412 enables the outbound buffers 414a of the data bus buffer 414. Accordingly, a positive outcome of a decision at either block 552 or block 558 results in data being copied from the internal side to the external side of the interface.

A negative outcome of a decision at either block 552 or block 558 results in the control block 412 proceeding either to block 562 or block 564. At each of these blocks, the control block 412 determines if it should enable the inbound buffers 414b of the data bus buffer 414. From block 562, the inbound buffers 414b are enabled if an external master owns the bus, and, from block 564, the inbound buffers 414b are enabled if an external slave owns the bus. Otherwise, from either block 562 or block 564, the buffers 414a and 414b are not enabled.

When implementing the general bus 322 of FIG. 3 as an AMBA ASB bus, the above discussion is modified in that the control block 412 proceeds from block 540 by enabling the associated outbound buffers. This is because, for the AMBA ASB bus, the slave response signals are constantly being driven by some device. When no slave is selected, the ASB decoder (e.g., 323 of FIG. 3) drives the response signals.

Decision-making transitions internal to the control block 412 flow from one flow segment to the next, for example, from FIG. 5a to FIG. 5b to FIG. 5c. Once the in illustrated flow of any of FIGS. 5a, 5b and 5c is complete, the control block 412 is adapted to continue monitoring the slave select and bus arbitration signals by picking up at the beginning of the next flow segment.

In accordance with other specific embodiments, the RSP7 User Guide, as attached hereto in the form of an appendix, may be referred to for additional information generally. This appendix is incorporated herein in its entirety.

For further information regarding the implementation of FIG. 4, reference may be made to U.S. patent application Ser. No. 09/216,291, also filed on Dec. 18, 1998, and entitled METHOD AND ARRANGEMENT FOR BUS EXTENSION WITH VIRTUAL TRANSPARENCY (Docket No. VLSI.237PA), incorporated herein by reference.

The present invention should not be considered lofted to the particular examples described above, but rather should be understood to cover all aspects of the invention as fairly set out in the attached claims. Various modifications, equivalent processes, as well as numerous structures to which the present invention may be applicable fall within the scope of the present invention. For example, the busses on either side of the two-way interface 320 of FIG. 3 do not necessarily have to be of the types discussed above. Further, the skilled artisan will appreciate that, while the programmable circuit 310 of FIG. 3 is readily designed from into a single chip, other multi-chip arrangements are also acceptable, and that such multi-chip arrangements can be implemented using a similarly constructed, or another variety of, two-way interface for communication between the chip arrangements. The claims are intended to cover such alternative approaches as well.

What is claimed is:

1. A method for designing a semiconductor circuit arrangement, comprising:

providing a deconfigurable and extendible reference-chip development platform that is programmable, and that includes a programmable circuit and a plurality of functional block macros;

using a collection of functional block macros at least one of which is obtained from the deconfigurable and extendible reference-chip development platform;

extending the deconfigurable and extendible reference-chip development platform, including communicatively coupling at least one external device with the reference-chip development platform, and therein providing an extended deconfigurable and extendible reference-chip development platform that enables co-development and co-validation of hardware and software;

synthesizing a subset of the collection of functional block macros to the programmable circuit; and validating a hardware representation of the synthesized subset of functional block macros in the programmable circuit within the extended deconfigurable and extendible reference-chip development platform.

2. A method, according to claim 1, further including modifying the subset of the functional block macros and synthesizing the subset of the functional block macros, as modified, to the programmable circuit.

3. A method, according to claim 2, wherein the programmable circuit is hardware reconfigurable and wherein synthesizing the subset of the functional block macros to the programmable circuit includes reconfiguring the programmable circuit.

4. A method, according to claim 3, wherein said validating includes using at least one external device communicatively coupled with the reference-chip development platform.

5. A method, according to claim 4, wherein the programmable circuit includes at least one of: an FPGA device; an FPGA plug-in board; an expansion board; and an external circuit communicatively coupling via the extended deconfigurable and extendible reference-chip development platform.

6. A method, according to claim 1, wherein at least one of the functional block macros in the subset is reused from the collection of functional block macros.

7. A method, according to claim 6, wherein said at least one reused functional block macro is reused from HDL code into the programmable circuit.

8. A method, according to claim 1, wherein at least one of the functional block macros in the subset is used from a functional block macro obtained from the deconfigurable and extendible reference-chip development platform and reused by retargeting to an ASIC that is developed from the hardware representation.

9. A method, according to claim 8, further including modifying the subset of the functional block macros and synthesizing the subset of the functional block macros, as modified, to the programmable circuit.

10. A method, according to claim 1, wherein at least one of the functional block macros in the subset is reused from the collection of functional block macros, and further including modifying the subset of the functional block macros and synthesizing the subset of the functional block macros, as modified, to the programmable circuit.

11. A system for designing a semiconductor circuit arrangement, comprising:
deconfigurable and extendible means, including a programmable circuit and a plurality of functional block macros, for developing a reference-chip;
means for using a collection of functional block macros at least one of which is obtained from the deconfigurable and extendible means;
means for extending the deconfigurable and extendible means, including means for communicatively coupling at least one external device with the deconfigurable and extendible means, and therein providing an extended deconfigurable and extendible means that enables co-development and co-validation of hardware and software;
means for synthesizing a subset of the collection of functional block macros to the programmable circuit; and
means for validating a hardware representation of the synthesized subset of functional block macros in the programmable circuit within the extended deconfigurable and extendible means.

12. A system, according to claim 11, wherein the means for synthesizing a subset of the collection of functional block macros to the programmable circuit and at least one of the deconfigurable and extendible means and the extended deconfigurable and extendible means, are adapted to modify the subset of the functional block macros and to synthesize the subset of the functional block macros, as modified, to the programmable circuit.

13. A system, according to claim 12, wherein the programmable circuit is hardware reconfigurable and wherein means for synthesizing the subset of the functional block macros to the programmable circuit is adapted to reconfigure the programmable circuit.

14. A system, according to claim 13, wherein the programmable circuit includes at least one of: an FPGA device; an FPGA plug-in board; an expansion board; and an external circuit communicatively coupling via the extended deconfigurable and extendible means.

15. A system, according to claim 11, wherein at least one of the functional block macros in the subset is reused from the collection of functional block macros.

16. A system, according to claim 15, wherein said at least one reused functional block macro is reused from HDL code into the programmable circuit.

17. A system, according to claim 11, wherein at least one of the functional block macros in the subset is used from a functional block macro obtained from the deconfigurable and extendible means and reused by retargeting to an ASIC that is developed from the hardware representation.

18. A system, according to claim 17, further including means for modifying the subset of the functional block macros and synthesizing the subset of the functional block macros, as modified, to the programmable circuit.

19. A system, according to claim 11, wherein at least one of the functional block macros in the subset is reused from the collection of functional block macros, and further including means for modifying the subset of the functional block macros and synthesizing the subset of the functional block macros, as modified, to the programmable circuit.

20. A system for designing a semiconductor device, comprising:
a deconfigurable and extendible reference-chip development platform that is programmable, and includes a hardware reconfigurable circuit and a plurality of functional block macros;
a collection of functional block macros at least one of which is obtained from the deconfigurable and extendible reference-chip development platform;
an interface circuit configured and arranged to extend the deconfigurable and extendible reference-chip development platform, including a two-way buffer arrangement and logic circuitry adapted to communicatively couple a plurality of external devices with the reference-chip development platform, and therein provide an extended deconfigurable and extendible referencechip development platform that enables co-development and co-validation of hardware and software;
a synthesizer adapted to cause said at least one of the functional block macros to be represented as a configuration of the hardware reconfigurable circuit; and
wherein the extended deconfigurable and extendible reference-chip development platform is adapted to validate the configuration in the hardware reconfigurable circuit within the extended deconfigurable and extendible reference-chip development platform.

21. A system for designing a semiconductor circuit arrangement, comprising:

a deconfigurable and extendible reference-chip development platform that is programmable, and includes a programmable circuit and a plurality of functional block macros;

a collection of functional block macros at least one of which is obtained from the deconfigurable and extendible reference-chip development platform;

an interface circuit configured and arranged to extend the deconfigurable and extendible reference-chip development platform, including a bus and logic circuitry adapted to communicatively couple at least one external device with the reference-chip development platform, and thereby providing an extended deconfigurable and extendible reference-chip development platform that enables co-development and co-validation of hardware and software;

a synthesizer adapted to cause the subset of the collection of functional block macros to be represented as a configuration of the programmable circuit; and wherein the extended deconfigurable and extendible reference-chip development platform is adapted to validate the configuration in the programmable circuit within the extended deconfigurable and extendible reference-chip development platform.

22. A system, according to claim 21, wherein the synthesizer and at least one of the deconfigurable and extendible reference-chip development platform and the extended deconfigurable and extendible reference-chip development platform, are adapted to modify the subset of the functional block macros and to synthesize the subset of the functional block macros, as modified, to the programmable circuit.

23. A system, according to claim 22, wherein the programmable circuit is hardware reconfigurable and wherein the synthesizer is adapted to reconfigure the programmable circuit.

24. A system, according to claim 23, wherein the programmable circuit includes at least one of: an FPGA device; an FPGA plug-in board; an expansion board; and an external circuit communicatively coupling via the extended deconfigurable and extendible reference-chip development platform.

25. A system, according to claim 21, wherein at least one of the functional block macros in the subset is reused from the collection of functional block macros.

26. A system, according to claim 25, wherein said at least one reused functional block macro is reused from HDL code into the programmable circuit.

27. A system, according to claim 21, wherein at least one of the functional block macros in the subset is used from a functional block macro obtained from the deconfigurable and extendible reference-chip development platform and reused by retargeting to an ASIC that is developed from the configuration.

28. A system, according to claim 27, further including means for modifying the subset of the functional block macros and wherein the synthesizer synthesizes the subset of the functional block macros, as modified, to the programmable circuit.

29. A system, according to claim 21, wherein at least one of the functional block macros in the subset is reused from the collection of functional block macros, and further including means for modifying the subset of the functional block macros and synthesizing the subset of the functional block macros, as modified, to the programmable circuit.

30. A system, according to claim 21, wherein the extended deconfigurable and extendible reference-chip development platform includes an emulation board.

* * * * *

UNITED STATES PATENT AND TRADEMARK OFFICE
CERTIFICATE OF CORRECTION

PATENT NO. : 6,347,395 B1
DATED : February 12, 2002
INVENTOR(S) : Payne et al.

It is certified that error appears in the above-identified patent and that said Letters Patent is hereby corrected as shown below:

<u>Title page,</u>
ABSTRACT, line 13, after "synthesized" please insert -- subset --.

Signed and Sealed this

Twenty-third Day of April, 2002

Attest:

Attesting Officer

JAMES E. ROGAN
Director of the United States Patent and Trademark Office